(12) United States Patent
Takenaka et al.

(10) Patent No.: US 7,222,685 B2
(45) Date of Patent: May 29, 2007

(54) DRIVE DEVICE WITH ELECTRONIC CIRCUIT

(75) Inventors: Masayuki Takenaka, Anjo (JP); Hiromichi Agata, Anjo (JP); Takeshi Hara, Anjo (JP); Kozo Yamaguchi, Anjo (JP)

(73) Assignee: Aisin AW Co., Ltd., Anjo (JP)

( * ) Notice: Subject to any disclaimer, the term of this patent is extended or adjusted under 35 U.S.C. 154(b) by 440 days.

(21) Appl. No.: 10/130,596

(22) PCT Filed: Sep. 25, 2001

(86) PCT No.: PCT/JP01/08305

§ 371 (c)(1),
(2), (4) Date: Jul. 24, 2002

(87) PCT Pub. No.: WO02/25087

PCT Pub. Date: Mar. 28, 2002

(65) Prior Publication Data

US 2003/0106727 A1    Jun. 12, 2003

(51) Int. Cl.
*B60K 17/04* (2006.01)
(52) U.S. Cl. .................................... 180/65.1
(58) Field of Classification Search ............ 439/33; 180/65.1, 65.2, 65.3, 65.8
See application file for complete search history.

(56) References Cited

U.S. PATENT DOCUMENTS

| 5,324,888 | A | | 6/1994 | Tyler et al. |
|---|---|---|---|---|
| 5,979,540 | A | | 11/1999 | Allison et al. |
| 6,001,723 | A | | 12/1999 | Kelkar et al. |
| 6,028,770 | A | * | 2/2000 | Kerner et al. ............... 361/704 |
| 6,166,498 | A | * | 12/2000 | Yamaguchi et al. .......... 318/34 |
| 6,181,574 | B1 | * | 1/2001 | Loibl ......................... 361/816 |
| 6,195,263 | B1 | * | 2/2001 | Aoike et al. ................ 361/752 |
| 6,201,365 | B1 | | 3/2001 | Hara et al. |
| 6,219,247 | B1 | | 4/2001 | Haupt et al. |

(Continued)

FOREIGN PATENT DOCUMENTS

DE    197 19 763 A1    11/1998

(Continued)

OTHER PUBLICATIONS

"VP 44 mit Steuergerat in Mikrohybridtechnik, Micro-hybrid Controller For Diesel Injection Pumps", MTZ Motortechnische Zeitschrift, Vieweg Verlag, Wiesbaden, DE, vol. 57, No. 12, Dec. 1996, p. 687, XP000639978, ISSN: 0024-8525.

*Primary Examiner*—Christopher P. Ellis
*Assistant Examiner*—Brian Swenson
(74) *Attorney, Agent, or Firm*—Oliff & Berridge, PLC

(57) ABSTRACT

A drive device with electronic circuit, including floated wiring for electrically connecting the solid wirings of a circuit to each other and an electronic circuit mechanically connected to an engine, wherein the electronic circuit is formed so that the flat surface thereof including the floated wiring is substantially disposed vertically relative to the output axis of the engine, whereby the vibration of the engine in the major X- and Z-directions can be prevented from applying to the floated wiring in Y-axis direction to increase the seismic resistance of the electronic circuit, and the arrangement of the drive device having the electronic circuit mechanically installed thereon can be realized.

9 Claims, 14 Drawing Sheets

U.S. PATENT DOCUMENTS

| | | |
|---|---|---|
| 6,318,329 B1 | 11/2001 | Sato |
| 6,323,613 B1 | 11/2001 | Hara et al. |
| 6,560,115 B1 * | 5/2003 | Wakabayashi et al. ...... 361/728 |
| 6,605,779 B2 * | 8/2003 | Takata et al. ............... 174/52.2 |

FOREIGN PATENT DOCUMENTS

| | | |
|---|---|---|
| DE | 198 37 663 A1 | 3/2000 |
| EP | 0 968 885 A2 | 1/2000 |
| EP | 1 000 790 A2 | 5/2000 |
| GB | 2 265 497 A | 9/1993 |
| JP | A 9-60540 | 3/1997 |
| JP | A 10-325357 | 12/1998 |
| JP | A 2000-18123 | 1/2000 |
| JP | A-2000-38941 | 2/2000 |
| JP | A 2000-161138 | 6/2000 |

* cited by examiner

DRIVE DEVICE WITH ELECTRONIC CIRCUIT

BACKGROUND OF THE INVENTION

1. Field of the Invention

The invention relates to a vehicular drive apparatus and, more particularly, to a technology for providing the drive apparatus with an integrated electronic circuit for controlling the drive apparatus.

2. Description of Related Art

A drive apparatus installed in a vehicle needs an electronic control unit for controlling a fuel supply system for the engine and a speed shift mechanism of the automatic transmission if the drive apparatus is a combination of a combustion engine (referred to as "engine" in this specification) and an automatic transmission. In the case of a hybrid drive apparatus that incorporates an engine and an electric motor (a motor or a motor-generator) as drive power sources, and that employs a transfer apparatus combined with the drive power sources, the drive apparatus needs a power unit and an electronic control unit for controlling a fuel supply system for the engine and a power line for the electric motor.

Conventionally, it is normal to dispose an electronic control unit and a power unit as mentioned above at locations in a compartment of a vehicle which have good thermal and vibrational conditions because these circuits incorporate chips that are susceptible to heat and vibrations.

In normal cases, since the electronic circuits of the electronic control unit and the power unit are not disposed at locations exposed to sever vibrations as mentioned above, there is no need to consider such vibrational conditions in disposing and arranging the electronic circuits. However, modules are now being used for the purpose of size and cost reduction. Along with this trend, it is conceived to mount an electronic circuit in an engine room, directly on an engine or indirectly from the engine via an accessory or the like. In this case, the electronic circuit is placed under a harsh condition where the circuit directly receives vibrations from the engine. Therefore, there are many problems related to resistances against such conditions. With regard to the thermal resistances of circuit materials of a module and chips embedded therein, some improvements have been made based on contrivances in cooling means. However, improvement in vibration resistance of a module as a whole is difficult. Thus, this technical idea has not been developed to a level of practical use.

SUMMARY OF THE INVENTION

Accordingly, in the invention, vibration-related weaknesses of an electronic circuit that forms an electronic control unit or a power unit have been considered. The invention thus enables integration of an electronic circuit with a drive apparatus by adopting an arrangement that compensates for the vibration-related weaknesses of the electronic circuit.

In order to achieve the aforementioned, the electronic circuit-equipped drive apparatus of the invention includes, as a first exemplary aspect, an electronic circuit which has float wirings that electrically connect solid wirings of a circuit, and which is mechanically connected to an engine, wherein the electronic circuit is disposed such that a plane that includes an arbitrary wiring of the float wirings is substantially perpendicular to an output axis of the engine. With this construction, in accordance with the first exemplary aspect, the electronic circuit is disposed so that a plane that includes the float wirings of the electronic circuit is perpendicular to the direction of the output axis of the engine in which direction the effect of vibrations is small, in any type of engine, in accordance with a fact that relatively great vibrations occur in torsional directions around the output axis of the engine and in directions perpendicular to the directions of the output axis, that is, in directions in which the force of explosion in each cylinder acts, rather than in the directions of the output axis. This construction prevents great vibrations of the float wirings in the directions perpendicular to the plane that includes the float wirings, which degrade the durability of the float wirings. Therefore, the construction improves the anti-vibration durability of the electronic circuit mechanically connected to the engine.

Next, the electronic circuit-equipped drive apparatus of the invention includes, as a second exemplary aspect, an electronic circuit which has float wirings that electrically connect solid wirings of a circuit, and which is mechanically connected to an engine having cylinder axes that are included in a common plane, wherein the electronic circuit is disposed such that a plane that includes the solid wirings is substantially perpendicular to the cylinder axes of the engine. With this construction, in accordance with the second exemplary aspect, the cylinder axes of the engine is included in a common plane. Even if there is no regularity in the directions of elongation of the float wirings of the electronic circuit, exertion of great vibrations of the engine on any float wiring in transverse directions with respect to the plane that includes the float wirings is substantially prevented. Therefore, improvement can be achieved in the anti-vibration durability of the electronic circuit which is mechanically connected to the engine and which has no regularity in the directions of elongation of float wirings.

Furthermore, the electronic circuit-equipped drive apparatus of the invention includes, as a third exemplary aspect, an electronic circuit which has electrical paths that are connected to the electronic circuit, form an input portion and an output portion, extend substantially in the same directions, and which are mechanically connected to an engine, wherein the electronic circuit is disposed in a posture such that a plane formed by the electronic circuit is substantially parallel to an output axis of the engine, and is disposed with a relationship such that an imaginary axis that represents a direction of extension of the electrical paths has a skew-line relationship to the output axis of the engine, and the imaginary axis that represents the direction of extension of the electrical paths and the output axis of the engine substantially perpendicularly intersect with each other in a plan view of the plane formed by the electronic circuit. With this construction, in accordance with the third exemplary aspect, the electronic circuit is disposed so that a plane defined by connecting members that form the electrical paths to the input portion and the output portion of the electronic circuit is perpendicular to the directions of a crankshaft in which directions the effect of vibrations is small (that is, parallel to the sliding directions of cylinders in which directions the effect of vibrations is great). This construction will reduce the effect of vibrations on the plane, and will reduce the rate of failures (broken wires and the like) of the connecting members (improves reliability).

Furthermore, the electronic circuit-equipped drive apparatus of the invention includes, as a fourth exemplary aspect, an electronic circuit which has float wirings that electrically connect solid wirings of a circuit, and which is mechanically connected to an engine having cylinder axes that are included in a common plane, wherein the electronic circuit is disposed such that among perpendicular planes from a plane that includes an arbitrary wiring of the float wirings, an intersecting perpendicular that intersects with a cylinder axis of the engine is substantially perpendicular to the cylinder axis of the engine. With this construction, in accordance with the fourth exemplary aspect, cylinder axes of the engine are included in a common plane. The directions of line elongation in which the float wirings of the electronic circuit have greatest resistance against vibrations are aligned with the directions in which great vibrations of the engine are exerted. Therefore, the vibrations exerted in the transverse directions relative to the plane that includes the float wirings are substantially eliminated, and the anti-vibration durability of the electronic circuit that is mechanically connected to the engine can be considerably improved.

Furthermore, the electronic circuit-equipped drive apparatus of the invention includes, as a fifth exemplary aspect, an electronic circuit which has electrical paths that are connected to the electronic circuit, form an input portion and an output portion, extend substantially in the same directions, and which are mechanically connected to an engine having cylinder axes that are included in a common plane, wherein the electronic circuit is disposed in a posture such that a plane formed by the electronic circuit is substantially perpendicular to a cylinder axis of the engine.

Furthermore, the electronic circuit-equipped drive apparatus of the invention includes, as a sixth exemplary aspect, an electronic circuit which has electrical paths that are connected to the electronic circuit, form an input portion and an output portion, extend substantially in the same directions, and which are mechanically connected to an engine having cylinder axes that are included in a common plane, wherein the electronic circuit is disposed in a posture such that an imaginary axis that represents a direction of extension of the electrical paths in a plane formed by the electronic circuit exists in a plane that is substantially the same as a plane of a cylinder axis of the engine.

Furthermore, the electronic circuit-equipped drive apparatus of the invention includes as a seventh exemplary aspect, an electronic circuit which has electrical paths that are connected to the electronic circuit, form an input portion and an output portion, extend substantially in the same directions, and which are mechanically connected to an engine, wherein the electronic circuit is disposed in a posture such that a plane that is perpendicular to a plane formed by the electronic circuit and that includes an imaginary axis representing a direction of extension of the electrical paths is substantially perpendicular to an output axis of the engine.

Furthermore, the electronic circuit-equipped drive apparatus of the invention includes, as an eighth exemplary aspect, an electronic circuit which has electrical paths that are connected to the electronic circuit, form an input portion and an output portion, extend substantially in the same directions, and which are mechanically connected to an engine having cylinder axes that are included in a common plane, wherein the electronic circuit is disposed such that, among perpendicular planes from a plane that is perpendicular to a plane formed by the electronic circuit and that includes an imaginary axis representing a direction of extension of the electrical paths, an intersecting perpendicular plane intersects with a cylinder axis of the engine is substantially perpendicular to the cylinder axis of the engine.

Furthermore, the electronic circuit-equipped drive apparatus of the invention includes, as a ninth exemplary aspect, an electronic circuit which has float wirings that electrically connect solid wirings of a circuit, and which is mechanically connected to an engine, wherein the electronic circuit is disposed in a direction such that a load caused on the float wirings substantially by vibrations of the engine becomes smallest. In accordance with the ninth exemplary aspect, it is effective to adopt a construction in which the electronic circuit is disposed substantially in a direction such that, where the load caused by vibrations of the engine is resolved in three directions that are a first direction of the float wirings in a plane that includes the solid wirings, a second direction perpendicular to the float wirings in the plane that includes the solid wirings, and a third direction perpendicular to the plane that includes the solid wirings, a load in the second direction is less than loads in the other two directions. In this case, it is further effective to adopt a construction in which the electronic circuit is disposed in a direction such that the load in the direction perpendicular to the float wirings in the plane that includes the solid wirings becomes zero.

Furthermore, the electronic circuit-equipped drive apparatus of the invention includes, as a tenth exemplary aspect, a construction comprising an electronic circuit which has electrical paths that are connected to the electronic circuit, form an input portion and an output portion, extend substantially in the same directions, and which are mechanically connected to an engine, wherein the electronic circuit is disposed in a direction such that a lowest load is caused on a connecting member that forms the electronic circuit substantially by vibrations of the engine. In this case, it is effective to adopt a construction in which the electronic circuit is disposed in a direction such that, where the load caused by vibrations of the engine is resolved in a first direction that is a direction of extension of the electrical paths, a second direction that is a direction perpendicular to the direction of extension of the electrical paths and that is a direction parallel to a plane formed by the electronic circuit, and a third direction that is a direction perpendicular to the plane formed by the electronic circuit, a load in the second direction becomes smaller than loads in the first and third directions. In this case, it is effective to adopt a construction in which the electronic circuit is disposed in a direction such that the load in the second direction becomes zero.

If, in any of the above-described constructions, the electronic circuit-equipped drive apparatus is a hybrid drive apparatus further comprising a first electric motor and a transfer apparatus that transfers power of the first electric motor and the engine, it is effective to adopt a construction in which the electronic circuit is a first switching element power module within a power unit that is mechanically connected to the engine via the transfer apparatus so as to supply an electric power to the first electric motor. In this case, if the hybrid drive apparatus further comprises a second electric motor, it is effective to adopt a construction in which the electronic circuit further includes a second switching element power module that is supplied with an electric power from the second electric motor.

In any one of the above-described constructions, the float wirings are bonding wires that connect the solid wirings by wire bonding. Furthermore, it is effective to dispose the switching element power module based on a setting related to a portion of a low lineal density of the bonding wires or a portion in which the bonding wires have a great length.

In these constructions, the electronic circuit, which is provided with a gelatinous material in many cases, is set in such a direction that the portions with low linear density are protected from vibrations, in accordance with a fact that portions with high linear density of bonding wires are unlikely to receive effect of vibrations because the bonding wires in such portions curb oscillation of the gelatinous material due to interactions among the bonding wires, whereas portions with low lineal density do not enjoy the vibration reducing advantage, but directly receive the effect of vibrations. Therefore, the setting serves to protect portions that are susceptible to vibrations in view of the entire electronic circuit. Hence, improvement is achieved in the anti-vibration durability of the electronic circuit that is mechanically connected to the engine. For the same reasons, if the electronic circuit is set in such a direction as to protect a portion in which the bonding wires have a great length from vibrations, in accordance with a fact that as the length of a bonding wires is greater, the bonding wire receives greater effect of oscillation of the gelatinous material, the setting serves to protect portions that are susceptible to vibrations in view of the entire switching element power module. As a result, improvement can be achieved in the anti-vibration durability of the switching element power module that is mechanically connected to the engine.

Furthermore, the bonding wires of the portion of the low lineal density are signal lines for sending switching signals from a control apparatus to the switching element power module. In this construction, the portion with low lineal density of bonding wires in the switching element power module as an electronic circuit that forms the power unit corresponds to a signal line that is provided for driving a switching element and that does not need to conduct a great amount of current from a battery. Therefore, adoption of a setting for protecting the signal line achieves protection of the portion that is susceptible to vibrations in view of the entire switching element power module. As a result, improvement can be achieved in the anti-vibration durability of the switching element power module that is mechanically connected to the engine.

In the above-described constructions, it is effective to adopt a construction in which the first and second switching element power modules are disposed in a same first member. In this construction, the arrangement of the first and second switching element power modules in the common first member facilitates the anti-vibration setting as described above, and enables a size reduction of the power unit by aggregate arrangement of the two modules. In this case, it is possible to adopt a construction in which the first member is disposed on an upper portion of the transfer apparatus so that the first member is tilted forward in a forward running direction of a vehicle. This construction makes it possible to curb the increase in the total height of the hybrid drive apparatus caused by the mechanical connection of the power unit to the engine.

Furthermore, if, in accordance with any one of the first to fourth exemplary aspects, the electronic circuit-equipped drive apparatus is a hybrid drive apparatus further comprising a first electric motor and a transfer apparatus that transfers power of the first electric motor and the engine, it is also effective to adopt a construction in which the electronic circuit is a first control circuit which controls the first electric motor, and which is disposed in an electronic control unit that is mechanically connected to the engine via the transfer apparatus. In this construction, if a second electric motor is further provided, it is possible to adopt a construction in which the electronic circuit further includes a second control circuit that is disposed in the electronic control unit and that controls the second electric motor. In this case, too, it is effective to adopt a construction in which the first and second control circuits are disposed in a same second member. Furthermore, it is also possible to adopt a construction in which the second member is disposed on an upper portion of the transfer apparatus so that the first member is tilted forward in a forward running direction of a vehicle. In these constructions, the arrangement of the first and second control circuits in the common second member facilitates the anti-vibration setting as described above, and enables a size reduction of the electronic control unit by aggregate arrangement of the two control circuits.

Still further, if the electronic circuit-equipped drive apparatus is a drive apparatus further comprising an automatic transmission that transfers power of the engine, the electronic circuit may be a control circuit which is disposed in an electronic control unit that is mechanically connected to the engine via the automatic transmission, and which controls the automatic transmission.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DETAILED DESCRIPTION OF PREFERRED EMBODIMENTS

Figure 1:
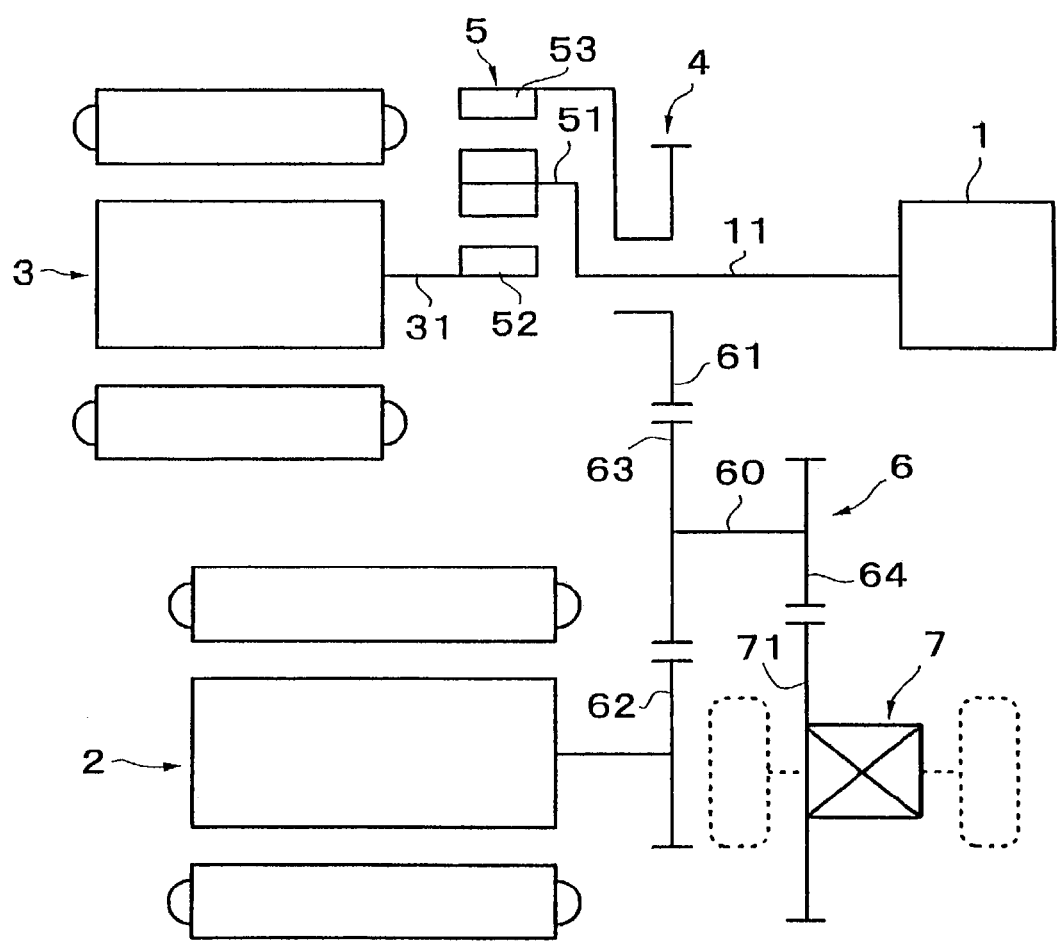
FIG. 1 is a skeleton diagram of a hybrid drive apparatus in accordance with a first embodiment of the invention.
Figure 2:
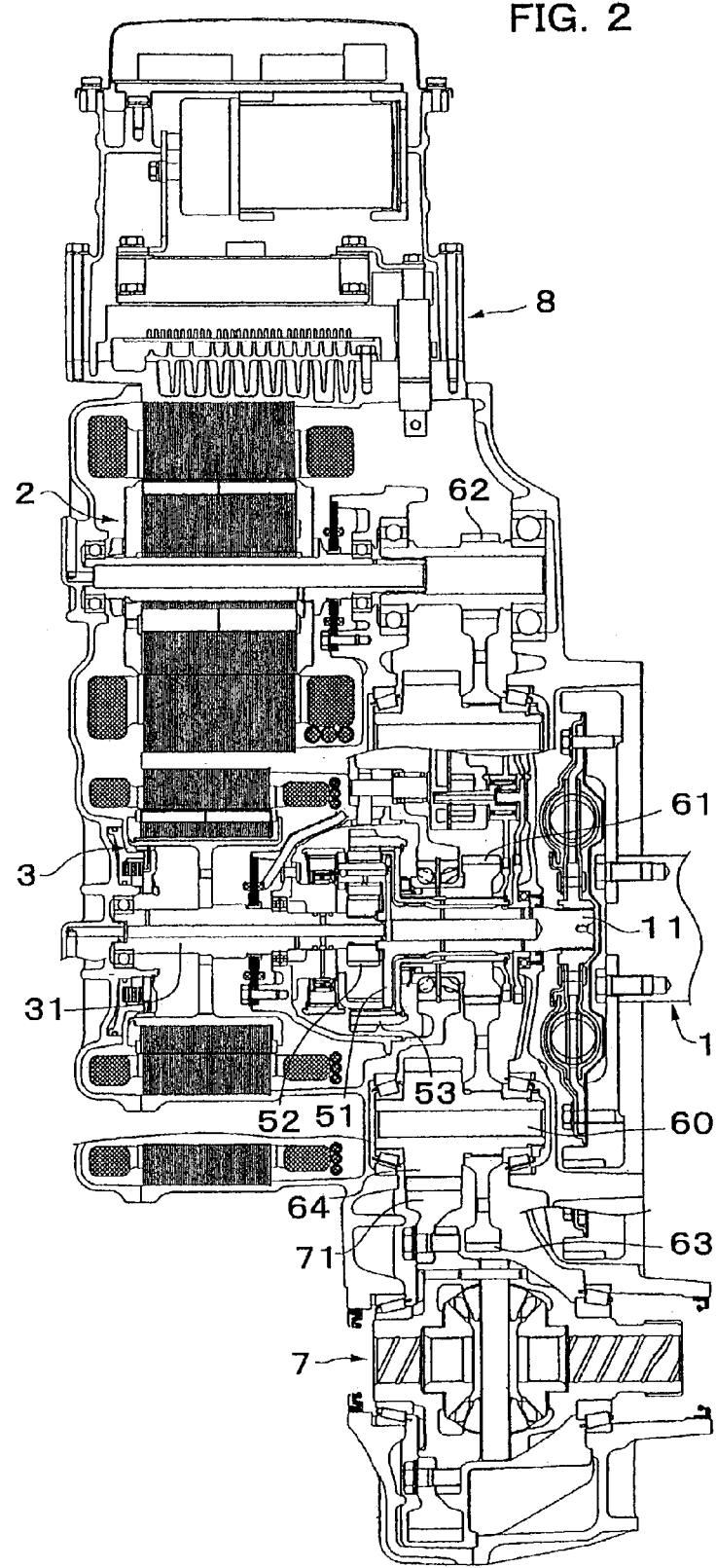
FIG. 2 is a sectional view taken in the direction of the axis, in which inter-axis arrangements are developed.

Embodiments of the invention will be described hereinafter with reference to the drawings. FIGS. 1 and 2 show an embodiment in which the invention is embodied as a transverse-placement hybrid drive apparatus dedicated to a front-engine and front-drive (FF) vehicle. FIG. 1 is a skeleton diagram of an overall construction. FIG. 2 is a sectional view of the construction taken along a direction of an axis, in which inter-axis arrangements are developed.

As shown in FIGS. 1 and 2, the apparatus is made up of an engine 1, a motor 2 provided as a first electric motor, a generator 3 as a second electric motor, and a transfer apparatus 4 that drivingly connects the aforementioned components to wheels.

The transfer apparatus 4 is made up of a planetary gear set 5, a counter gear mechanism 6, and a differential device 7. The planetary gear set 5 forms a differential gear apparatus that connects the engine 1 and the generator 3 to an engine-side drive gear 61 of the counter gear mechanism 6. As for three elements of the planetary gear set 5, a carrier 51 is connected to an output shaft 11 of the engine 1, a sun gear 52 is connected to a rotor shaft 31 of the generator 3, and a ring gear 53 is connected to the engine-side drive gear 61. The counter gear mechanism 6 has a drive-connection relationship in which a driven gear 63 provided on a counter shaft 60 is meshed with the engine-side drive gear 61 and a motor-side drive gear 62, and a differential drive pinion gear 64 provided on the counter shaft 60 is meshed with a ring gear 71 of the differential device 7.

Figure 3:
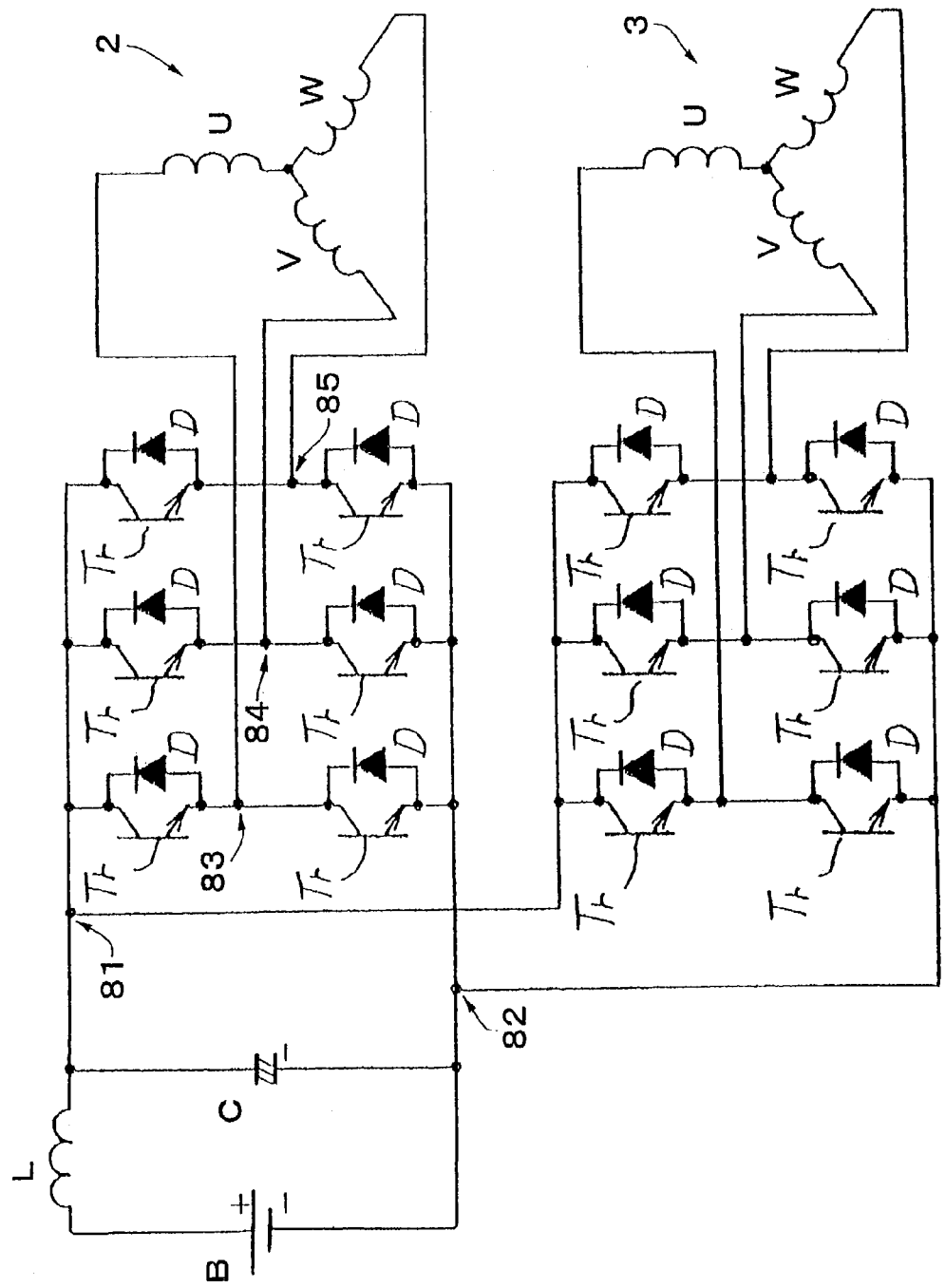
FIG. 3 is a circuit diagram of power lines of the drive apparatus.

In the drive apparatus described above, the invention is applied to an electronic circuit of a power unit 8 (see FIG. 2) that is placed in a power line of the motor 2 and the generator 3. If the motor 2 and the generator 3 are formed by 3-phase AC electric motors, it is necessary to provide switching circuits in power lines connecting 3-phase windings U, V, W of the motor 2 and the generator 3 to a battery B as illustrated in a schematic circuit diagram of FIG. 3. Each switching circuit is formed by a combination of a transistor Tr and a diode D, and receives, at a base of the transistor Tr, a switching signal from an electronic control unit (not shown) so as to operate as an AC-DC converting inverter. The switching circuits are connected to the battery B via a smoothing circuit that includes a capacitor C and a reactance L.

Figure 4:
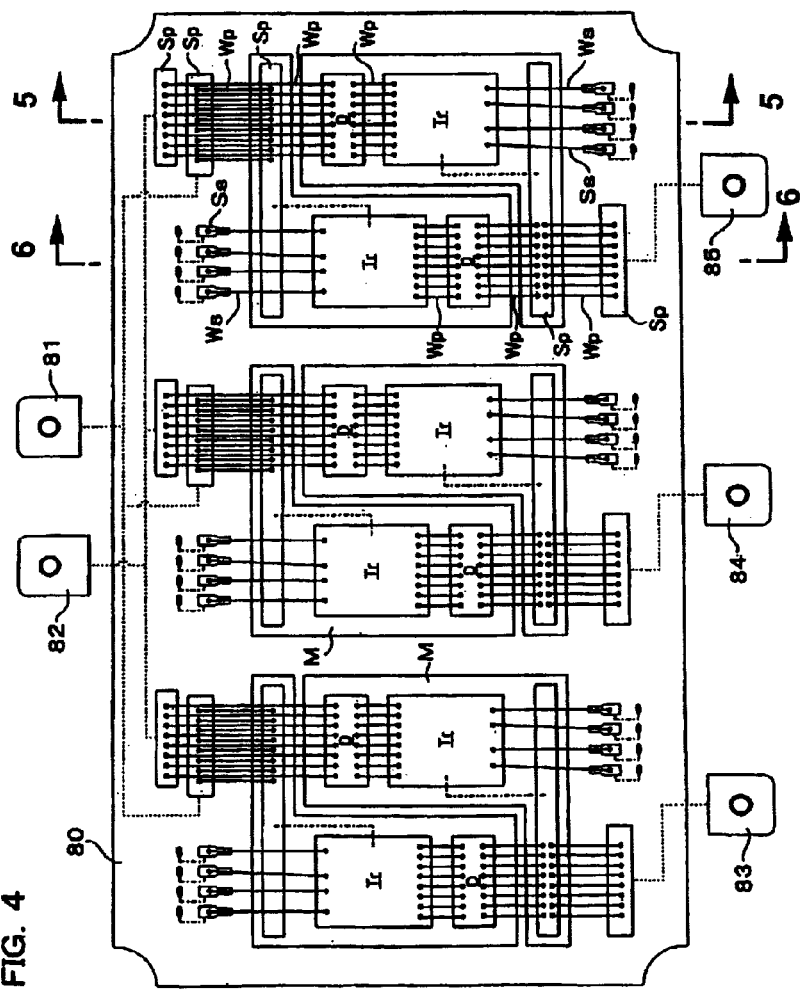
FIG. 4 is a plan view of a power module of a power unit in accordance with the embodiment.

This electronic circuit is substantially formed as shown in FIG. 4, which representatively shows a plan-view configuration of a motor (substantially the same electronic circuit is used for a generator). That is, the electronic circuit is formed by a switching element power module (hereinafter, referred to as "module" in the description of embodiments) in which transistors Tr and diodes D are embedded in a module case 80 having a solidified circuit formed by integrating wirings with a substrate. Connections between the transistors Tr and the diodes D and connections between terminals and solid wirings S (which are thus termed in the invention in order to collectively refer to the pad portions and wirings provided to form circuits in the module case 80, and terminals of the embedded chips, and to discriminate these wirings from float wirings) of the module case 80 are made by bonding wires W that form float wirings. Of these bonding wires W, wires Wp of power lines that conduct large currents from the battery to the motor form high-lineal-density wirings of parallel arrangements for the purpose of securing good current capacity. Wires Ws of signal lines that input switching signals from the electronic control unit (not shown) form low-lineal-density wirings with individually different functions.

In FIG. 4, one or two of the four parallel connecting wires are switching signal lines connected to the base of each transistor Tr, and the other connecting wires are signal lines of sensors and the like. Solid wirings Ss of the signal lines in the module case 80 are indicated by one-dot chain lines, and solid wirings Sp of power lines in the module case 80 are indicated by dotted lines. Terminals (referred to as "input portions") 81, 82 form a positive-negative pair at a side of the module case 80 and are connected to the battery by solid wiring Sp. Three terminals (referred to as "output portions") 83 to 85 are disposed at another side of the module case 80 and are connected to the winding of the motor or the generator by solid wirings Sp.

Figure 5:
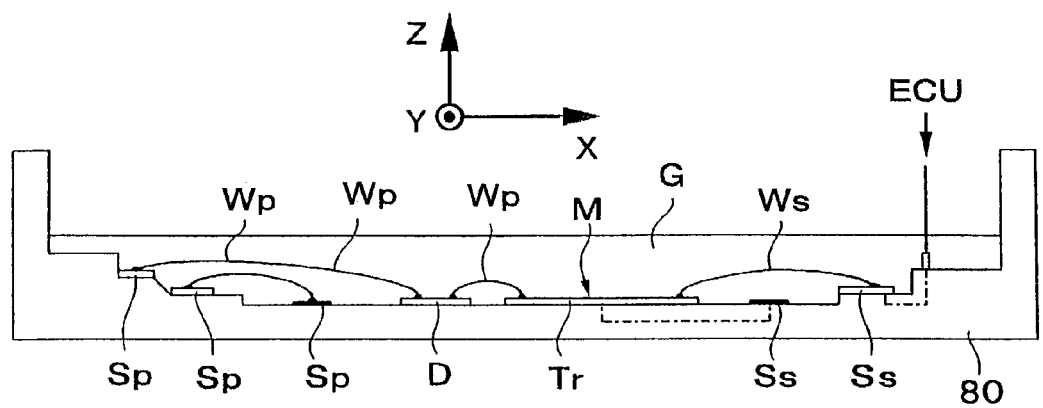
FIG. 5 is a sectional view taken along line 5-5 in FIG. 4.
Figure 6:
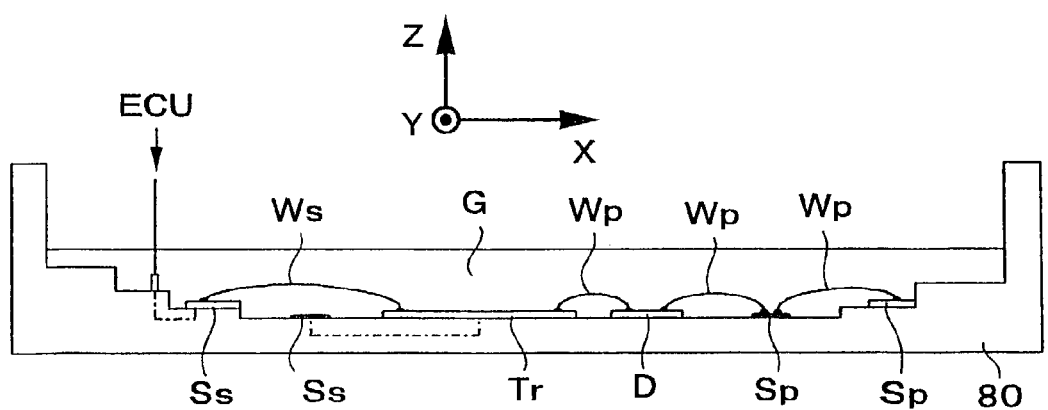
FIG. 6 is a sectional view taken along line 6-6 in FIG. 4.

As shown in the sectional views of FIGS. 5 and 6, each bonding wire W is a float wiring that connects solid wirings S. In particular, the bonding wires Ws of the signal line solid wirings Ss are float wirings having a long span with a relatively low lineal density. Unlike the bonding wires Wp of the parallel-connection power line solid wirings Sp, the bonding wires Ws are not in a perfectly parallel arrangement, but form approximately parallel connections with a low linear density.

Figure 7:
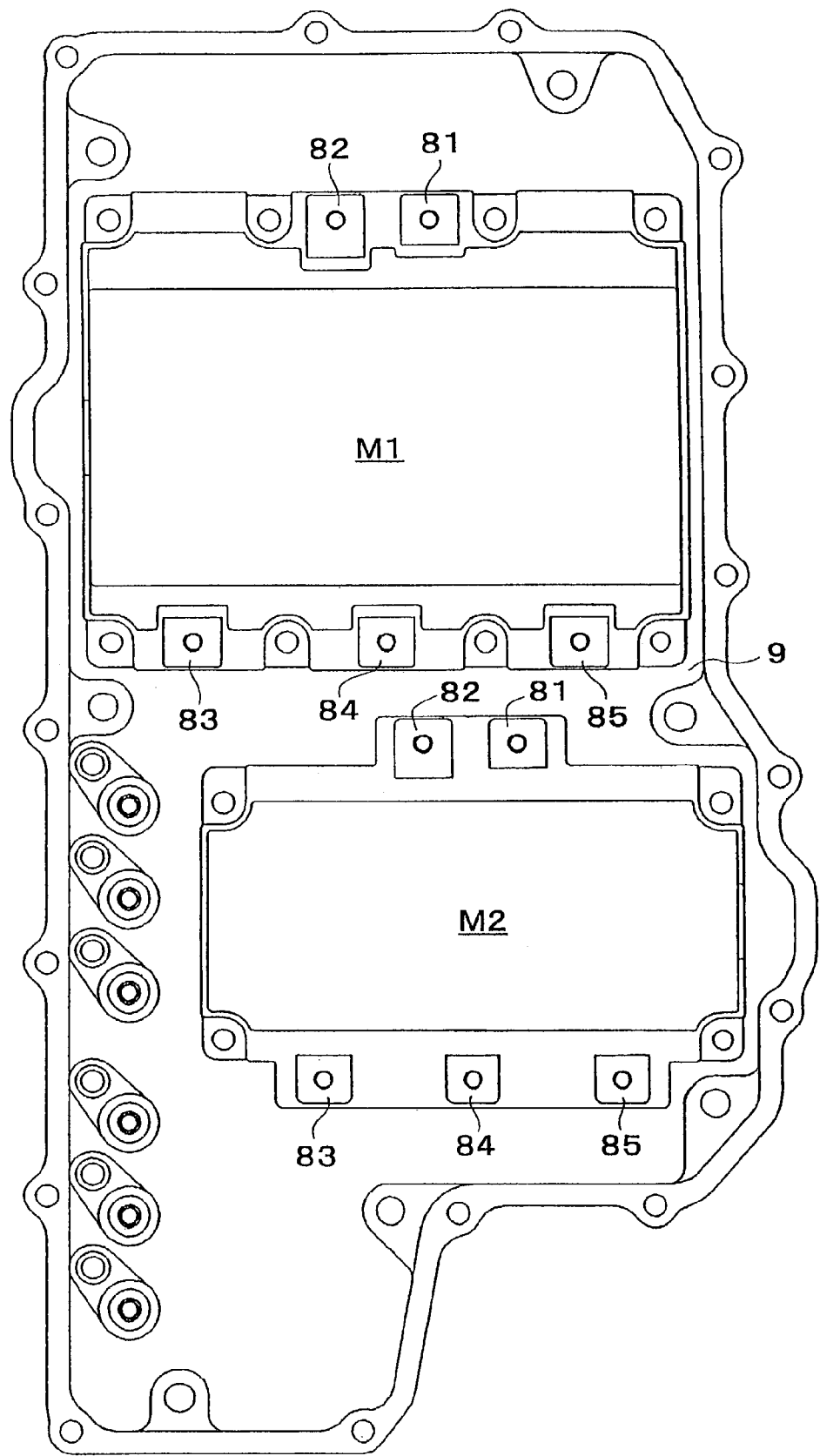
FIG. 7 is a plan view of a power unit in accordance with the embodiment.

As for the module M constructed as described above, a motor-purposed module M1 and a generator-purposed module M2 are fixed side by side onto a heat sink 9 provided as a first member as shown in FIG. 7, which is a plane view of the configuration thereof, that is, in such a manner that the directions of the input portions 81, 82 and the output portions 83 to 85 of the modules are aligned. The modules M1, M2 are mechanically connected to an upper portion of the drive apparatus via the heat sink 9, as shown in FIG. 8, which is a cross sectional view of the drive apparatus.

Figure 8:
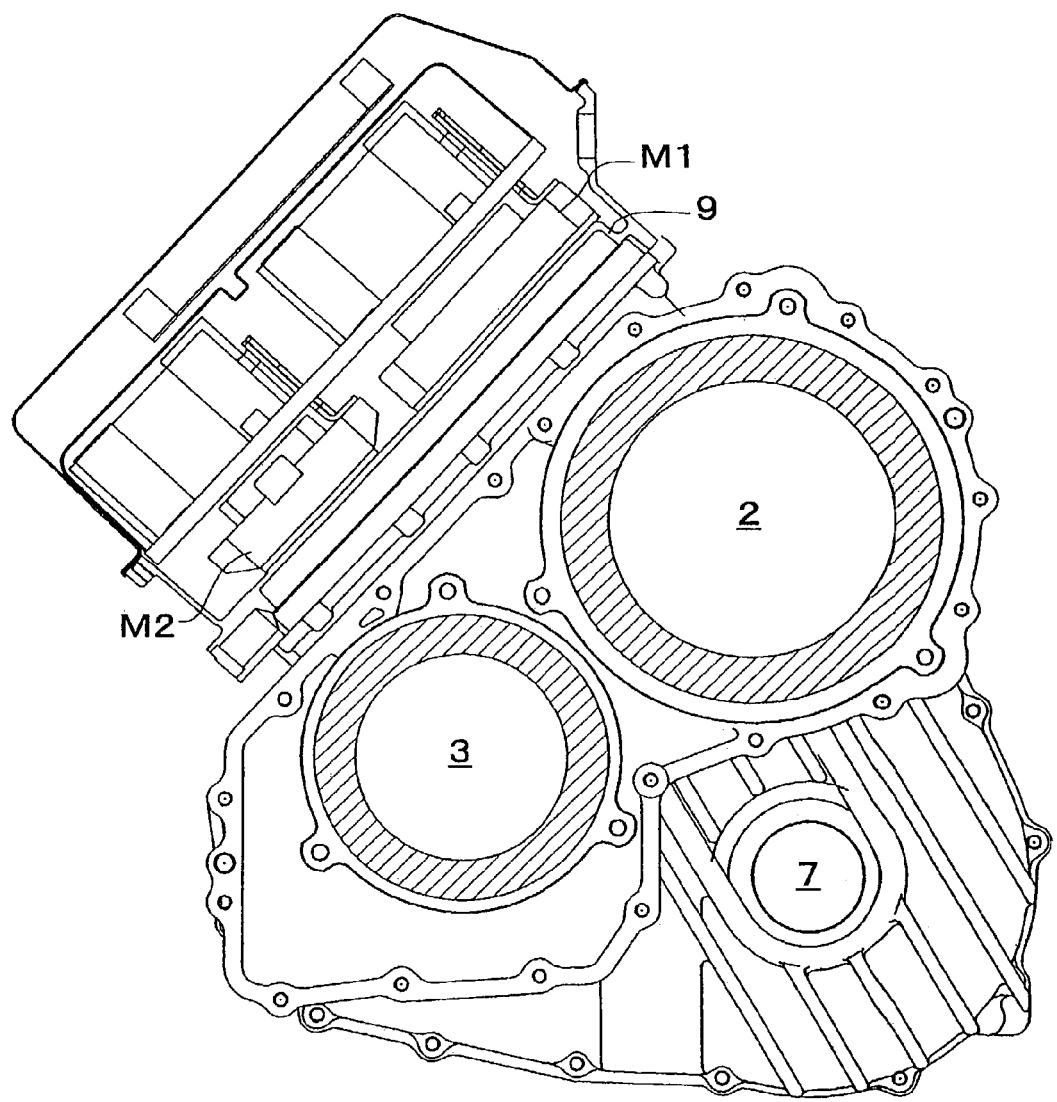
FIG. 8 is a cross sectional view of the hybrid drive apparatus in accordance with the embodiment.

In FIG. 8, the left side corresponds to a front portion of the vehicle when the heat sink 9, with the modules M1, M2, is installed in the vehicle. The generator 3 is disposed relatively upward of and forward of the differential device 7 connected to the wheels. The motor 2 is disposed upward and relatively forward of the differential device 7. The heat sink 9 is disposed so as to substantially circumscribe or outwardly touch the generator 3 and the motor 2. Therefore, the modules M1, M2 assumes a posture in which the modules are tilted toward the front of the vehicle.

As can be understood from the above-described positional relationship with reference to FIGS. 7 and 8, the modules M1, M2 are arranged so that the electric paths from the input portions 81, 82 to the output portions 83-85 (direction of electric current) are substantially perpendicular to the output axis of the engine (coaxial with the axis of the generator 3). In a view from the float wirings of the modules M1, M2, the modules are disposed in a posture such that a plane that includes the float wirings substantially perpendicularly intersects with the output axis of the engine.

Incidentally, with regard to a plane including the aforementioned float wiring, if the unselective line structuring of the float wiring is a straight line directed to the direction of the plane, the unselective line is included in the plane and the plane absolutely including the float wiring is structured. If the float wiring is cross vaulted to the plane, it is not included in this definition. However, even in this case, if the connecting points with the solid wiring at both ends and the top of the arch of the line are included in the plane, the same effect is achieved, which is the effect in case all of them are substantially included. Therefore, in this invention, the plane including the float wiring includes a plane structured by braiding more than three points on an unselective line.

Even when part of the float wirings directs to another direction with other wirings, if the float wiring as a whole is directed to the same direction, it is included. Even when the individual wiring is out of alignment to some degree, or a plane including it is inclined somewhat, if it is in an area which the effect is achieved.

Reasons for adopting the above-described posture will be explained with reference to FIGS. 5 and 6. Each bonding wire W fixed at two ends thereof repeats thermal expansion and contraction in the direction of the wire length based on the different expansion rates of the bonding wire W and the module case 80 as a circuit substrate upon thermal loads. Therefore, a crack is likely to form in a neck portion (a reverse side of a joint portion between the wire and the solid wiring) where the stress due to the repeated thermal expansion and contraction concentrates. Such a crack is likely to initiate corrosion. An effective countermeasure against this problem is employment of a gelatinous material G having viscoelasticity, such as silicon-based resins, epoxy-based resins, etc., as a shield material that covers at least the neck portion without giving the bonding wire W stress caused by thermal expansion and contraction. The gelatinous material G is also effective to release heat occurring in circuit chips (transistors Tr, diodes D) to the circuit-forming substrate. Therefore, the adoption of this method is considered virtually essential in the electric circuits of a direct mount construction.

However, due to its viscoelasticity, the gelatinous material G, upon receiving vibrations, undergoes viscous vibrations in a mode different from that of solid vibrations of the bonding wire W or the module case 80 as a circuit-forming substrate. Therefore, the viscous vibrations of the gelatinous material G may vibrate the bonding wire W relative to the module case 80. A study of the vibratory relationship between the gelatinous material G and the bonding wire W has revealed that the vibration of the gelatinous material G in the direction of an arch of the bonding wire W (which is the direction of an X axis in a three-dimensional coordinate system defined on an assumption that the direction of wire elongation is defined as the direction of the X axis and the circuit-forming substrate elongates in the X-Y-axes directions) has the least effect on the bonding wire W, followed by the vibration in the up and down directions relative to the arch (the directions of the Z axis in the above-defined coordinate system), and the greatest adverse effect on the bonding wire W is caused by the vibration in the transverse directions relative to the arch (the directions of the Y axis in the coordinate system) and, more particularly, in the case where the arch span is long. It has been also revealed that the effect of vibrations in transverse directions relative to the arch is reduced if the interval between parallel bonding wires W is small, that is, if the wiring density is high.

From this vibration relationship, the inventors have reached a conclusion that an effective anti-vibration measure is prevention of exertion of vibrations in the transverse directions relative to the arch on bonding wires W having long arch spans or low wiring density among the bonding wires W, which are float wirings and are most susceptible to vibrations in view of the strength of the entire module M, regardless of whether the gelatinous material G is provided. Since the bonding wires W in question correspond to the bonding wires Ws of signal lines in this embodiment, the above-described construction is adopted so as to realize the direction setting of the module M.

This direction setting is a most restricted but versatile setting that is applicable to all types of engines, such as in-line multi-cylinder engines, horizontally opposed multi-cylinder engines, V-type multi-cylinder engines, rotary engines, etc. This setting can be schematically illustrated as a positional relation in FIG. 9 in relation to an in-line multi-cylinder engine. In this case, the module M as an electronic circuit has a positional relationship to the engine 1 in which the X-Z plane that includes the float wiring W of the module M is substantially perpendicular to the output axis of the engine 1 that extends in the direction of the Y axis. In a relationship to a V-type multi-cylinder engine schematically illustrated in FIG. 10, the module M is disposed so that the X-Z plane that includes the float wiring W of the module M is substantially perpendicular to the output axis of the engine 1 (the direction of the Y axis). This relationship holds if the module M is tilted about the Y axis as indicated by a dotted line in FIG. 10.

Figure 11:
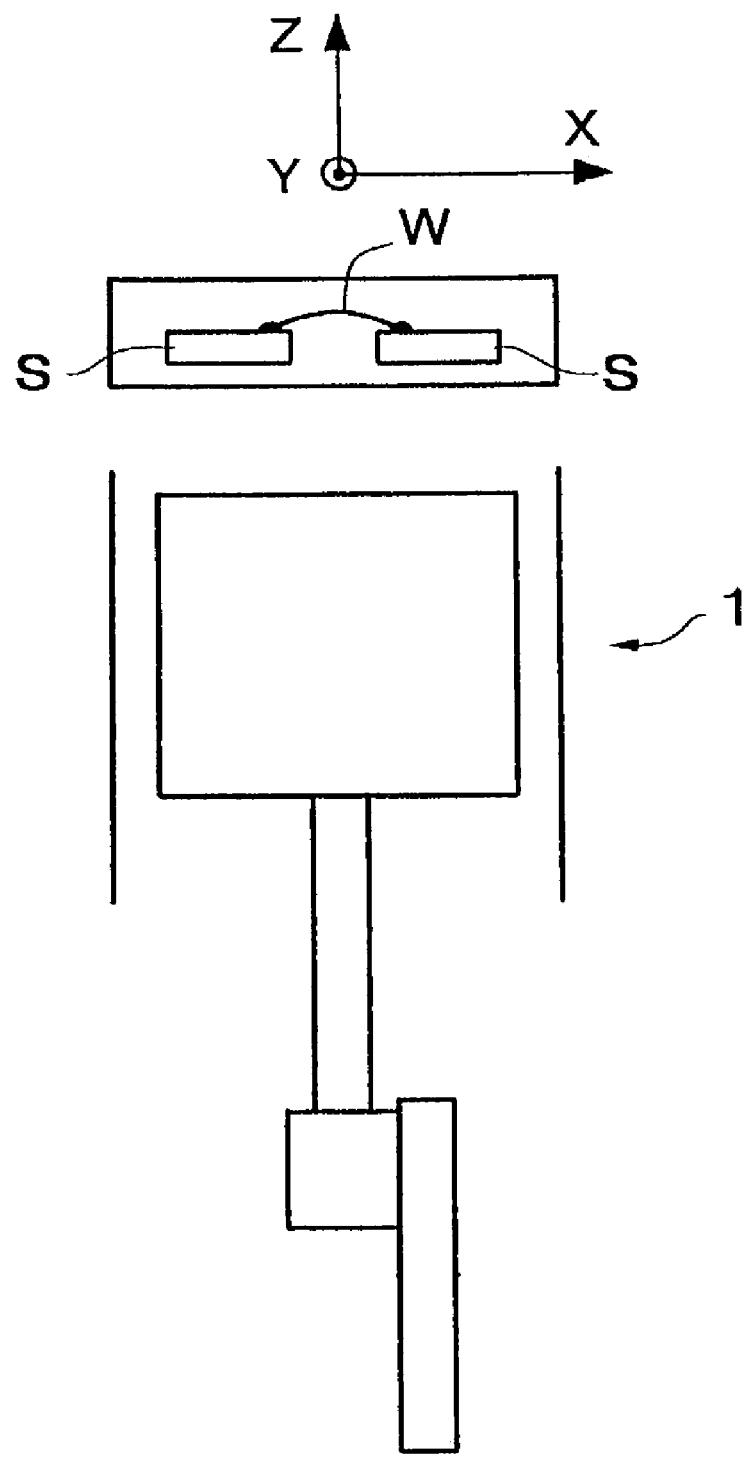
FIG. 11 is a schematic diagram showing another example of the setting of the power module on an in-line multi-cylinder engine.

A setting with looser restrictions is possible in the case of in-line multi-cylinder engines or horizontally opposed multi-cylinder engines. In this case, as shown in FIG. 11, the exertion of vibrations on the float wiring in the transverse directions relative to the arch (the direction of the Y axis) can be prevented merely by setting a posture of the module M such that the X-Y plane that includes solid wiring S, that is, the circuit-forming substrate surface, intersects substantially perpendicularly with the cylinder axes of the engine 1 (the direction of the Z axis). Therefore, a second best setting condition can be met, irrelevant to the direction of elongation of the float wiring W, that is, even if the module M is turned about the Z axis.

Figure 12:
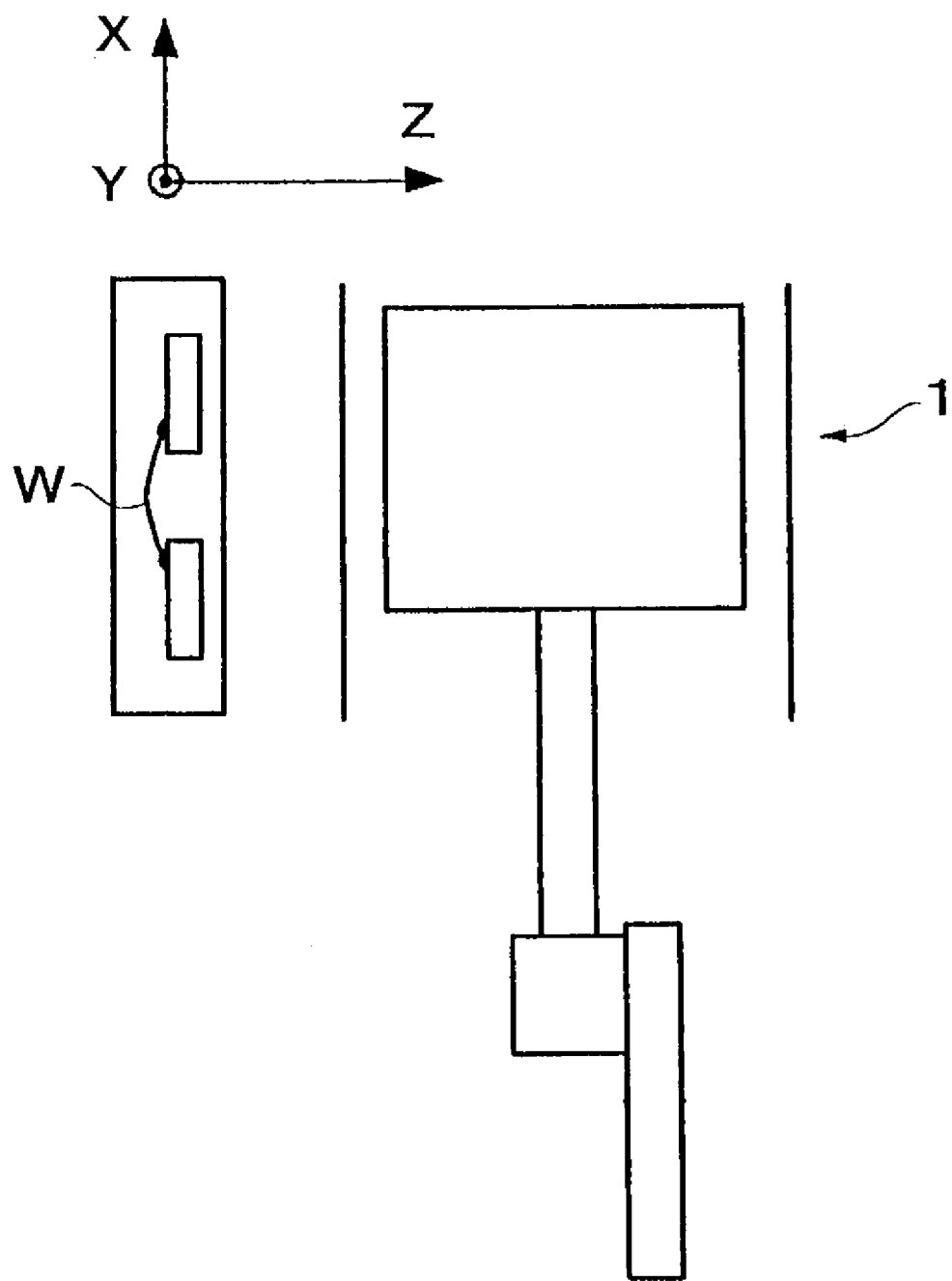
FIG. 12 is a schematic diagram showing still another example of the setting of the power module on an in-line multi-cylinder engine.

Under the conditions of the aforementioned type of engine, the X-Z plane including the float wiring W is set in such a posture that the plane is substantially parallel to the cylinder axis of the engine 1 (direction of the X axis) as shown in FIG. 12, the vibration of the bonding wire W in the directions of the arch span becomes the greatest. Therefore, in this posture, a most advantageous setting can be made among the various versatile settings. This arrangement is particularly effective if the module is attached to a rear cover provided at an end portion of the drive apparatus opposite from the engine in the longitudinal direction of the vehicle (a left side surface of the drive apparatus in FIG. 2).

Therefore, according to this drive apparatus, the modules M1, M2 are arranged so that a plane that includes the bonding wires W of the modules M1, M2 is perpendicular to the direction of the output axis of the engine 1 in which direction the effect of vibrations is small, regardless of the type of engine 1, in accordance with the fact that relatively great vibrations occur in torsional directions around the output axis of the engine 1 and in directions perpendicular to the directions of the output axis. That is, in directions in which the force of explosion in each cylinder acts, rather than in the directions of the output axis. This arrangement prevents great vibrations of the bonding wire W in the directions perpendicular to the plane that includes the bonding wires W, which degrade the durability of the bonding wire W. Therefore, the arrangement improves the anti-vibration durability of the modules M1, M2 mechanically connected to the engine 1.

In the modules M1, M2 provided with the gelatinous material G as described above, portions with high lineal density of bonding wires W are unlikely to receive the effect of vibrations because the bonding wires W in such portions curb oscillation of the gelatinous material G due to interactions among the bonding wires W. In contrast, portions with low lineal density do not enjoy the vibration reducing advantage, but directly receive the effect of vibrations. Therefore, the modules M1, M2 are set in such a direction that the portions with low lineal density are protected from vibrations. Thus, the setting serves to protect portions that are susceptible to vibrations in view of the entire modules M1, M2. Hence, improvement is achieved in the anti-vibration durability of the modules M1, M2 mechanically connected to the engine 1.

Furthermore, the arrangement of the modules M1, M2 on the heat sink 9 as a common first member facilitates the anti-vibration setting. This aggregate arrangement of the two modules M1, M2 enables a size reduction of the power unit. Still further, the cooling via the heat sink 9 improves the heat resisting characteristic. The forward-tilted mount posture of the power unit 8 curbs an increase in the total height of the hybrid drive apparatus.

While the invention has been described with reference to embodiments in which the invention is embodied as a power unit of a transverse-placement hybrid drive apparatus dedicated to FF vehicles, the invention is not limited to those embodiments. An electronic circuit in accordance with the invention may be applied as a control unit of a drive apparatus. The embodiment of the invention applicable for a control unit of a drive apparatus is described.

Figure 13:
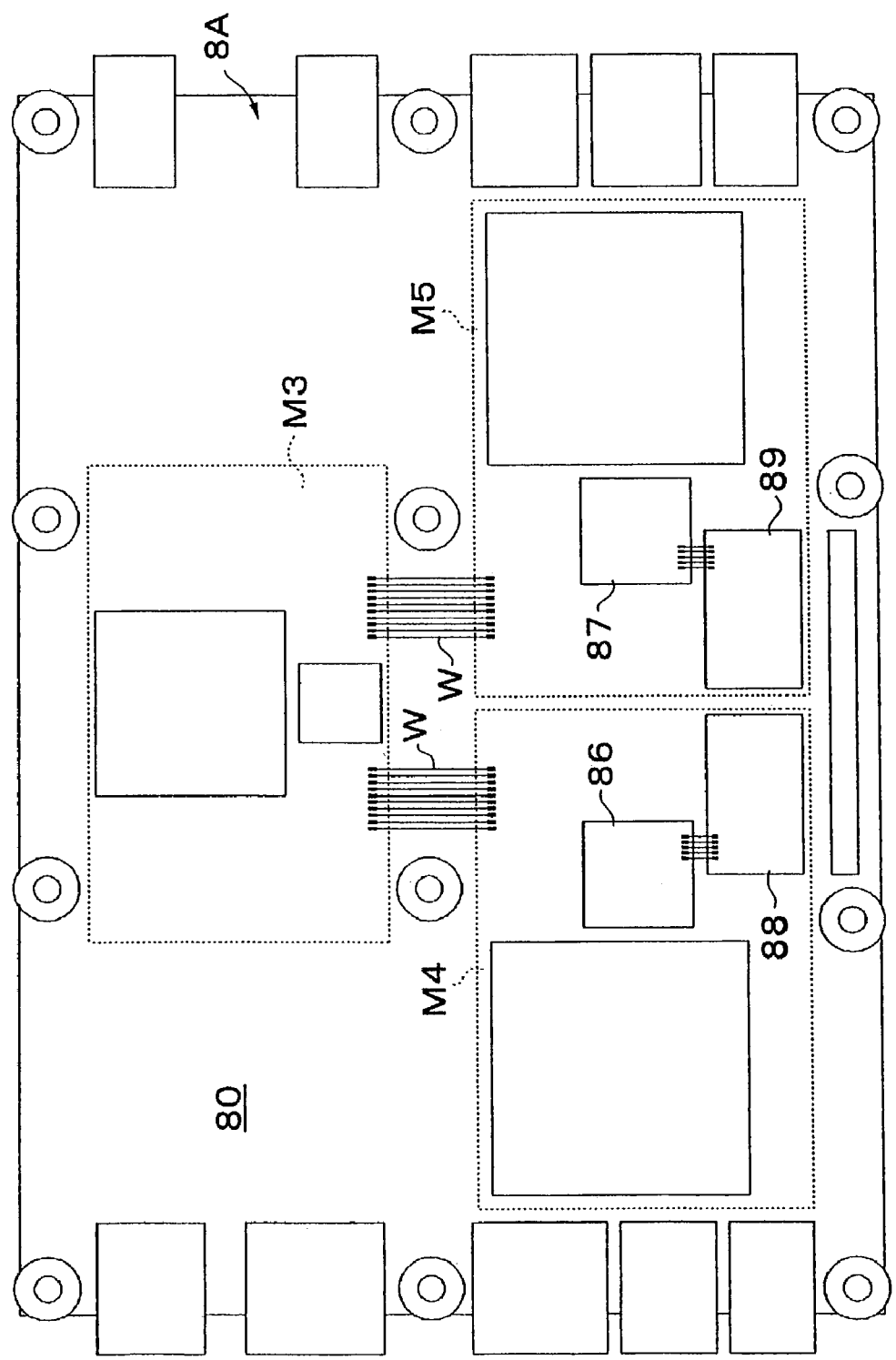
FIG. 13 is a plan view of a control module of an electronic control unit of a hybrid drive apparatus.

As shown in FIG. 13 illustrating a plan-view configuration, a control unit 8A in this embodiment has an arrangement formed by disposing, on a circuit-forming substrate 80, a first control circuit (indicated by a dotted-line enclosure) M4 that forms a motor control circuit, and a second control circuit (indicated by a dotted-line enclosure as well) M5 that forms a generator control circuit in a side-by-side and bilateral-symmetrical arrangement with respect to a transaxle control circuit (indicated by a dotted-line enclosure as well) M3 which forms a higher-level circuit for the two circuits responsible for a motor control and a generator control. The transaxle control circuit M3 and the first and second control circuits M4, M5 are interconnected via parallel-connected bonding wires W. In the first control circuit M4 and the second control circuit M5, microcomputers 86, 87 and flash memories 88, 89 are interconnected via similar parallel wirings. These parallel wirings are also arranged in parallel to each other and bilaterally symmetrical about the transaxle control circuit M3.

As in the case of the float wirings of the power unit described above, it is possible to achieve a relationship between the arrangement and the advantage similar to that described in conjunction with the power unit with reference to FIGS. 9 to 12, by adopting an arrangement in which the direction of elongation of connecting wires is set to the direction of the X axis based on the aforementioned definition.

Furthermore, the invention is similarly applicable to a case where the drive apparatus includes an engine and an automatic transmission. In this case, the electronic circuit is realized as a control circuit formed by a transmission control module of the electronic control unit for an automatic transmission. An example of this case will be described below as a second embodiment.

Figure 14:
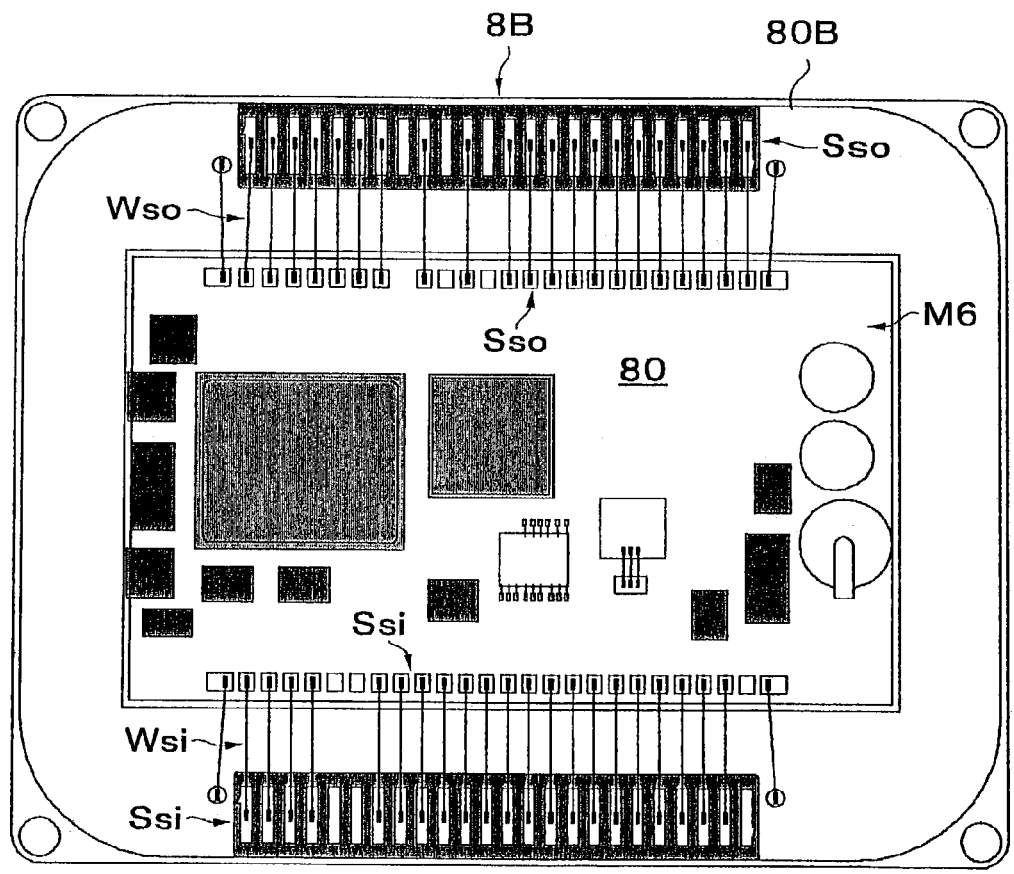
FIG. 14 is a plan view of a control module of an electronic control unit that incorporates a transmission control module of an automatic transmission in accordance with a second embodiment of the invention.

As shown in FIG. 14, which illustrates a plan-view configuration, a transmission control module M6 in this embodiment has an arrangement in which input terminals Ssi are disposed in line at a side in the circuit-forming substrate 80 provided with a microcomputer and a flash memory, and output terminals Sso are disposed in line at another side. In a parallel fashion in relation to these lines of terminals, an input terminal pad portion and an output terminal pad portion are provided in a unit case 80B. The terminals Ssi, Sso on the circuit-forming substrate 80 and terminals Ssi, Sso in the pad portions on the unit case 80B are interconnected via parallel connecting wires of bonding wires Wsi, Wso. In this arrangement, the input-side electrical path formed by parallel connecting wires of the input portion and the output-side electrical path formed by parallel connecting wires of the output portion extend in the same directions. Therefore, as in the case of the bonding wires in the first embodiment, if the direction of extension of the electrical paths forming the input portion and the output portion is represented by an imaginary axis and the imaginary axis is directed in the direction of the X axis based on the aforementioned definition, this embodiment achieves substantially the same advantages as those achieved by the first embodiment.

Figure 9:
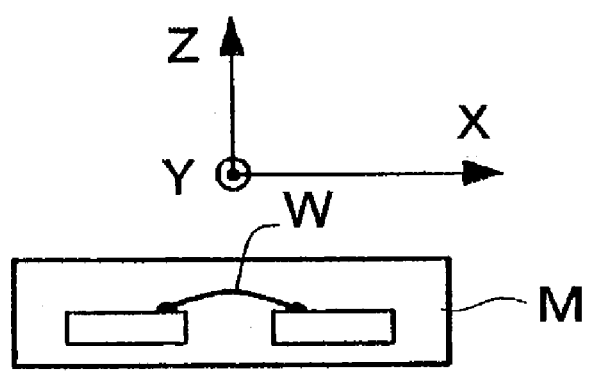
FIG. 9 is a schematic diagram showing an example of the setting of the power module on an in-line multi-cylinder engine.
Figure 9:
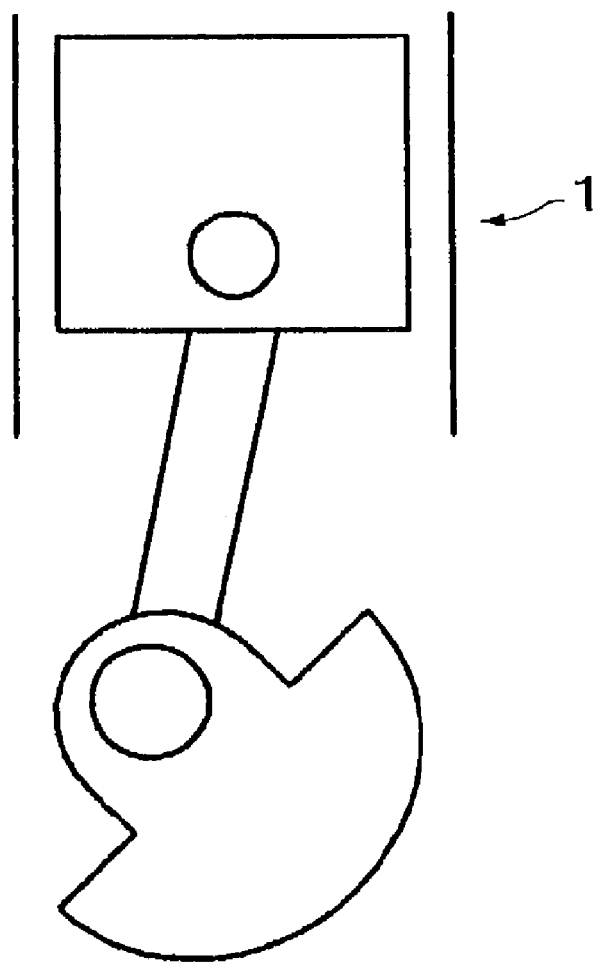
Figure 10:
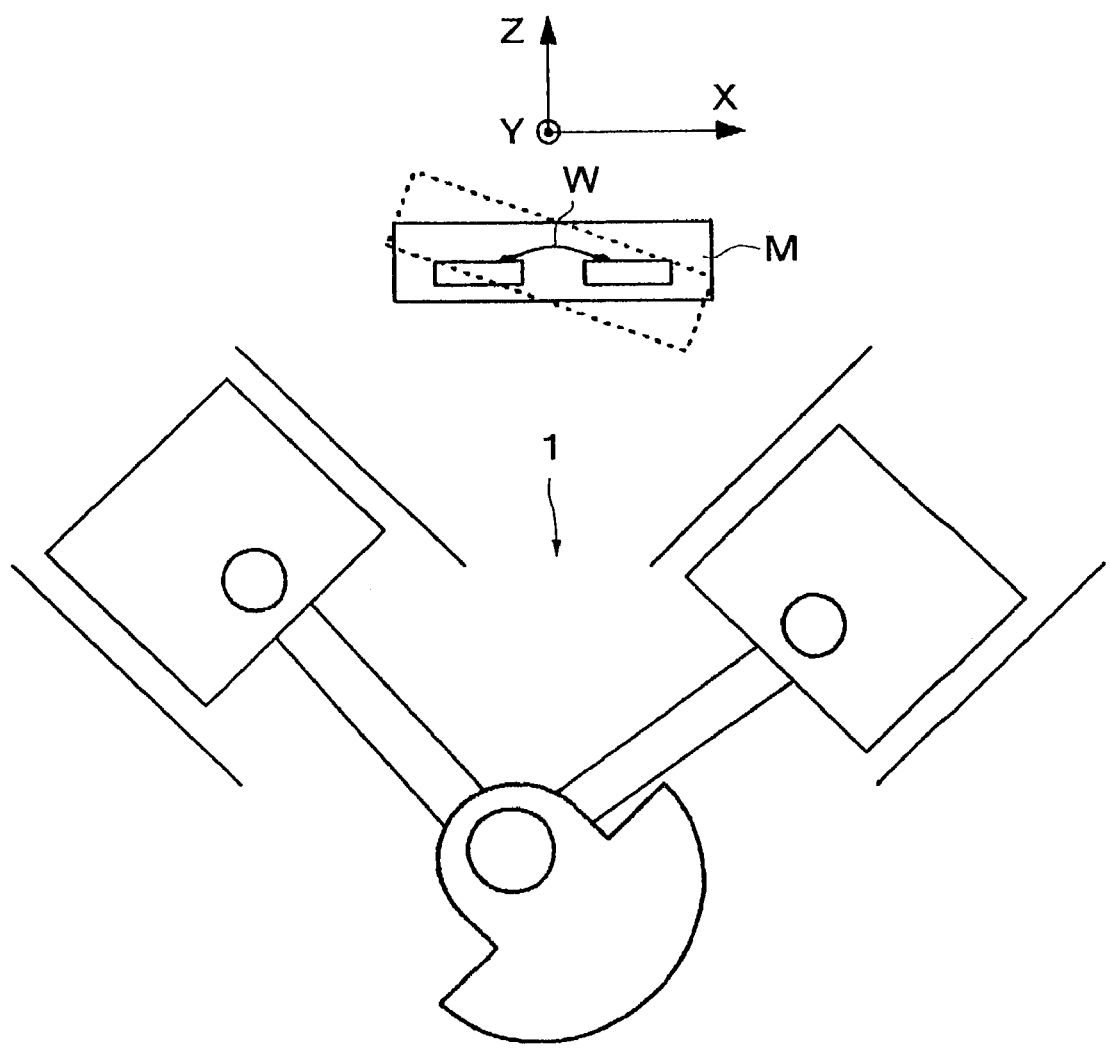
FIG. 10 is a schematic diagram showing an example of the setting of the power module on a V-type multi-cylinder engine.
Figure 15:
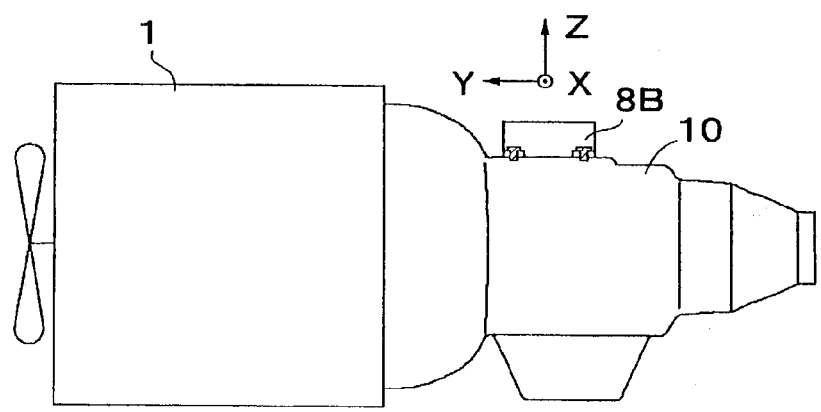
FIG. 15 is a side view showing an example of the arrangement of the electronic control unit.
Figure 16:
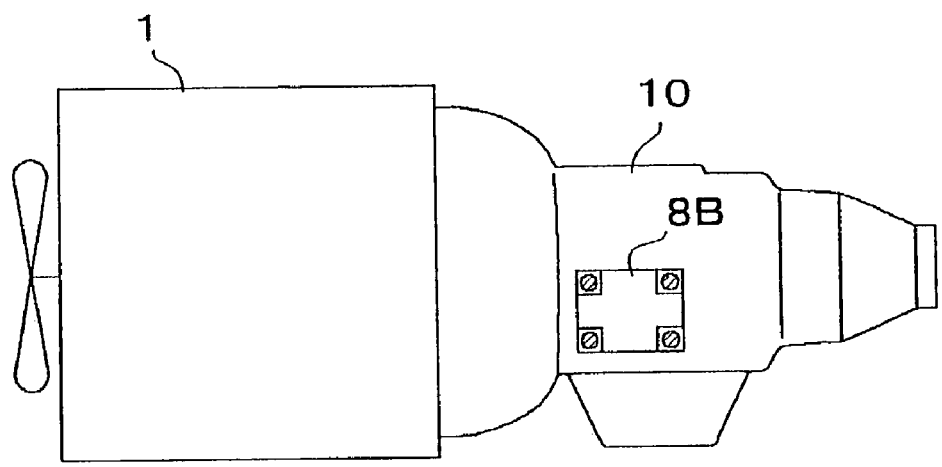
FIG. 16 is a side view showing another example of the arrangement of the electronic control unit.

Specific arrangements in this embodiment are shown in FIGS. 15 and 16. That is, in the arrangement shown in FIG. 15, an electronic control unit (ECU) 8B containing the transmission control module M6 is directly mounted on an upper surface of a case of an automatic transmission 10 connected to the engine 1. The electronic control unit 8B in this arrangement is disposed in a posture such that the direction of extension of the electrical paths (X-axis direction) intersects perpendicularly with the output axis of the engine 1 (Y-axis direction) in a plan view of the circuit-forming substrate 80 from above. In this arrangement, the bonding wires Ws (see FIG. 14) forming the electrical paths have an arrangement relationship as indicated in FIG. 9 or 10.

If the engine 1 is an in-line multi-cylinder engine, the direction of the bonding wires is perpendicular to the direction of piston stroke of the engine 1. However, the bonding wires are oriented in a direction parallel to the torsional directions about the output axis (Y-axis direction). Therefore, a technical idea of preventing exertion of vibrations in transverse directions relative to the arch direction of the bonding wire Ws in accordance with the invention is realized. In the case of this arrangement, tilt of the electronic control unit 8B about the X axis is also allowed.

Figure 17:
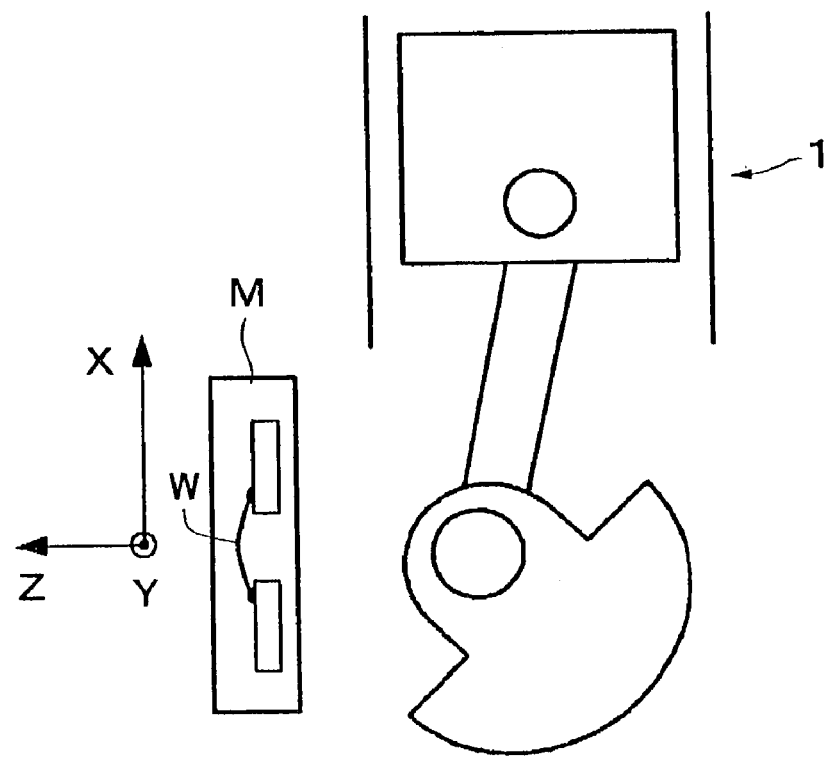
FIG. 17 is a schematic view illustrating an embodiment of the setting of the electronic control unit on an in-line multi-cylinder engine.

In the arrangement shown in FIG. 16, the electronic control unit 8B is directly mounted on a side surface of a case of the automatic transmission 10 connected to the engine 1. The electronic control unit 8B in this arrangement is disposed in a posture such that the direction of extension of the electrical paths is perpendicular to the output axis of the engine 1 in a plan view of the circuit-forming substrate 80 from above, that is, in a view of the circuit-forming substrate 80 from a side of the transmission case. In this arrangement, the bonding wires Ws forming the electrical paths are arranged as shown in FIG. 17 if an in-line multi-cylinder engine is assumed. In the arrangement of FIG. 17, the bonding wires Ws are directed in a direction that is parallel to the direction of piston stroke of the engine 1 (X-axis direction), and that is also parallel to the torsional directions about the output axis (Y-axis direction). Therefore, a technical idea of preventing exertion of vibrations in transverse directions relative to the arch direction of the bonding wire Ws in accordance with the invention is realized. In the case of this arrangement, tilt of the electronic control unit 8B about the Y axis is allowed.

While the invention has been described with reference to embodiments in which the invention is applied to a drive apparatus combining a hybrid drive apparatus, an engine and an automatic transmission, the invention is not limited to these drive apparatuses, but may be applied to various drive apparatuses. As for details of the electronic circuit, the float wirings may also be wire connection mean, such as a bus bar or the like, instead of bonding wires. Furthermore, as for the form of mechanical connection of the electronic circuit to the drive apparatus, it is also possible to adopt a mounting structure that employs damping means, such as a damper, an elastic body, etc. The invention can be carried out with various modifications of specific constructions within the scope defined in the claims. The terms "perpendicular" and "parallel" expressing directional relationships in the claims and the description of embodiments are not strict in meaning, but cover the allowable ranges of deviation within the range of technical common knowledge in view of the gist of the invention.

As described above, the drive apparatus of the invention is widely applicable to cases in which an electronic circuit is mechanically connected, in all types of drive apparatuses that need electronic circuits for controlling the drive apparatuses, in vehicles equipped with both an engine and an electric motor, vehicles equipped with a normal transmission or a continuously variable transmission, electric vehicles, etc.

The invention claimed is:

1. An electronic circuit-equipped drive apparatus, comprising:
an electronic circuit which has float wirings that electrically connect solid wirings of a circuit, and which is mechanically connected to an engine having cylinder axes that are included in a common plane, wherein the electronic circuit is disposed such that a plane that includes the solid wirings is substantially perpendicular to the cylinder axes of the engine.

2. An electronic circuit-equipped drive apparatus, comprising:
an electronic circuit which has float wirings that electrically connect solid wirings of a circuit, and which is mechanically connected to an engine having cylinder axes that are included in a common plane, wherein the electronic circuit is disposed such that among perpendicular planes to a plane that includes an arbitrary wiring of the float wirings, an intersecting perpendicular plane intersects with a cylinder axis of the engine is substantially perpendicular to the cylinder axis of the engine.

3. An electronic circuit-equipped drive apparatus, comprising:
an electronic circuit which has electrical paths that are connected to the electronic circuit, and that form an input portion and an output portion, and that extend substantially in the same directions and which is mechanically connected to an engine having cylinder axes that are included in a common plane, wherein the electronic circuit is disposed in a posture such that a plane formed by the electronic circuit is substantially perpendicular to a cylinder axis of the engine.

4. An electronic circuit-equipped drive apparatus, comprising:
an electronic circuit which has float wirings that electrically connect solid wirings of a circuit, and which is mechanically connected to an engine, wherein the electronic circuit is disposed in a direction such that a lowest load is caused on the float wirings by vibrations of the engine.

5. The electronic circuit-equipped drive apparatus according to claim 4, wherein the electronic circuit is disposed substantially in a direction such that, where the load caused by vibrations of the engine is resolved in three directions that are a first direction of the float wirings in a plane that includes the solid wirings, a second direction perpendicular to the float wirings in the plane that includes the solid wirings, and a third direction perpendicular to the plane that includes the solid wirings, a load in the second direction is less than loads in the other two directions.

6. The electronic circuit-equipped drive apparatus according to claim 5, wherein the electronic circuit is disposed in a direction such that the load in the second direction becomes zero.

7. An electronic circuit-equipped drive apparatus, comprising:
an electronic circuit which has electrical paths that are connected to the electronic circuit, and that form an input portion and an output portion, and that extend substantially in the same directions, and which is mechanically connected to an engine, wherein the electronic circuit is disposed in a direction such that a lowest load is caused on a connecting member that forms the electronic circuit substantially by vibrations of the engine.

8. The electronic circuit-equipped drive apparatus according to claim 7, wherein the electronic circuit is disposed in a direction such that, where the load caused by vibrations of the engine is resolved in a first direction that is a direction of extension of the electrical paths, a second direction that is a direction perpendicular to the direction of extension of the electrical paths and that is a direction parallel to a plane formed by the electronic circuit, and a third direction that is a direction perpendicular to the plane formed by the electronic circuit, a load in the second direction becomes smaller than loads in the first and third directions.

9. The electronic circuit-equipped drive apparatus according to claim 8, wherein the electronic circuit is disposed in a direction such that the load in the second direction becomes zero.

* * * * *